United States Patent
Chi

(10) Patent No.: US 6,175,605 B1
(45) Date of Patent: Jan. 16, 2001

(54) EDGE TRIGGERED DELAY LINE, A MULTIPLE ADJUSTABLE DELAY LINE CIRCUIT, AND AN APPLICATION OF SAME

(75) Inventor: Min-Hwa Chi, Hsinchu (TW)

(73) Assignee: Vanguard International Semiconductor Corporation, Hsin-Chu (TW)

( * ) Notice: Under 35 U.S.C. 154(b), the term of this patent shall be extended for 0 days.

(21) Appl. No.: 09/047,540

(22) Filed: Mar. 25, 1998

(51) Int. Cl.[7] .............................. H04L 7/00; H03L 7/00; H03H 11/26
(52) U.S. Cl. .................. 375/371; 375/354; 327/161; 327/263; 327/276; 327/277; 327/284
(58) Field of Search .................... 375/354, 371, 375/377; 713/400, 401, 500, 501; 327/141, 161, 263, 269, 270, 271, 276, 277, 278, 284, 261

(56) References Cited

U.S. PATENT DOCUMENTS

| | | | |
|---|---|---|---|
| 4,675,546 | 6/1987 | Shaw | 307/265 |
| 5,243,227 | 9/1993 | Gutierrez, Jr. et al. | 307/605 |
| 5,378,946 | 1/1995 | Reime | 327/14 |
| 5,459,422 | * 10/1995 | Behrin | 327/276 |
| 5,589,788 | * 12/1996 | Goto | 327/276 |
| 5,892,384 | * 4/1999 | Yamada et al. | 327/277 |
| 5,923,613 | * 7/1999 | Tien et al. | 365/233 |

OTHER PUBLICATIONS

"A 10ps Jitter 2 Clock Cycle Lock Time CMOS Digital Clock Generator Based on an Interleaved Synchronous Mirror Delay Scheme", T. Saeki et al, Digest of Tech. Papers—Symp. On VLSI Circuits IEEE, 1997.

T. Saeki et al. "A 2.5ns Clock Access 250MHz 256Mb SDRAM with a Synchronous Mirror Delay", IEEE International Solid State Circuits Conference Paper #SP23.4, p. 374.5, 1996.

* cited by examiner

Primary Examiner—Stephen Chin
Assistant Examiner—Betsy L. Deppe
(74) Attorney, Agent, or Firm—George O. Saile; Stephen B. Ackerman; Billy J. Knowles

(57) ABSTRACT

An edge triggered adjustable delay line circuit to determine the difference in time between a transition of a first signal and a transition of the second signal; a variably additive delay line circuit that will delay an input signal by a delay factor that is the sum of a multiplicity of variable delay factors; and a timing synchronization circuit to synchronize an internal timing signal with an external timing signal within one timing cycle is described. The timing synchronization circuit will utilize the edge triggered delay line and the variably additive delay line circuits to determine the synchronization parameters to synchronize the internal timing signal with the external timing signal.

24 Claims, 7 Drawing Sheets

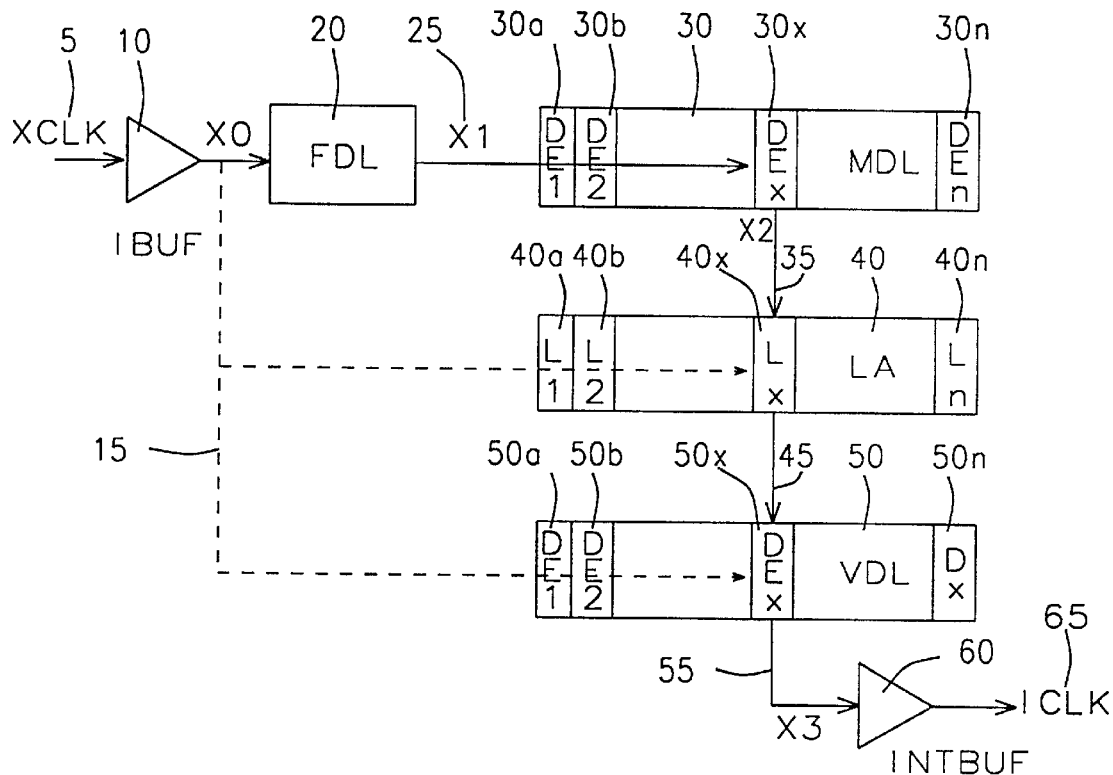
FIG. 1 - Prior Art
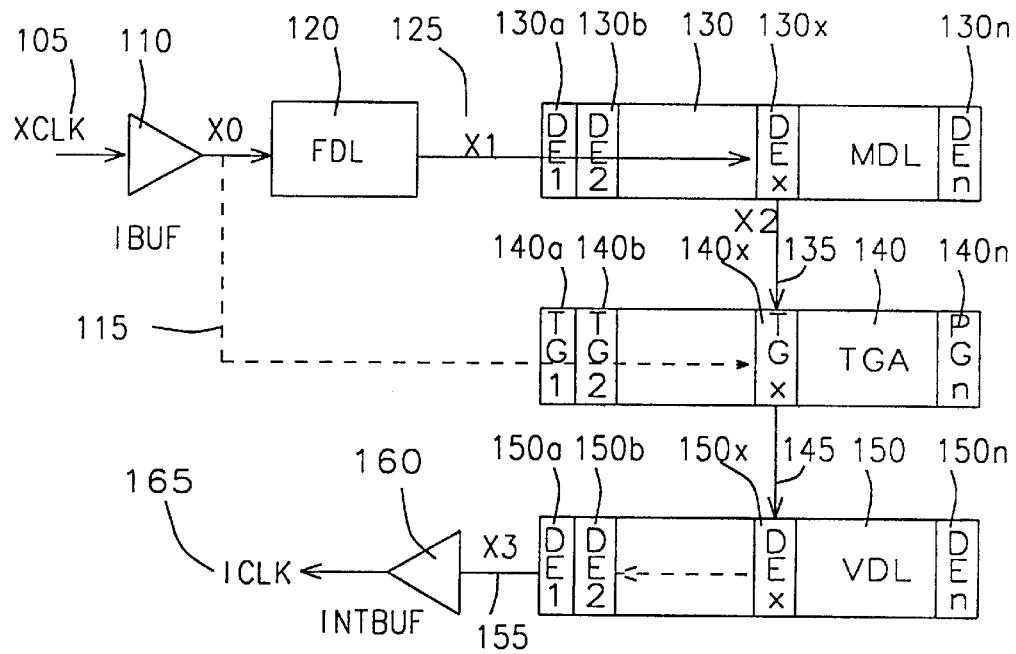
FIG. 2 - Prior Art

EDGE TRIGGERED DELAY LINE, A MULTIPLE ADJUSTABLE DELAY LINE CIRCUIT, AND AN APPLICATION OF SAME

RELATED PATENT APPLICATIONS

VIS86-139, A New Clock Synchronized Delay Scheme Using Edge-Triggered Delay Lines And Latches With One Clock Lock Time, Ser. No. 09/047,541, Filing Date Mar. 25, 1998. Assigned to the Same Assignee as the Present Invention.

FIELD OF THE INVENTION

This invention relates to programmable delay lines, and more particularly to delay lines that are activated by edge transitions of input signals, and to delay line circuits that have multiple adjustable delay lines.

DESCRIPTION OF RELATED ART

Delay lines and silicon delay circuits are well known in the art. Delay lines generally are circuits composed of resistors, capacitors and/or inductors coupled to semiconductor amplifiers or buffers. The signal at the output of the delay line will be delayed by a period of time determined by the reactances of the resistive, capacitive, and/or inductive circuit. Silicon delay lines for digital signals such as clocks, as implemented on integrated circuits, are often formed of a chain of simple inverter circuits. The total delay of the chain of inverters will be the composite delay of the individual inverter circuits. The outputs of individual inverters or groups of inverters maybe the input to buffer circuits to provide multiple delayed outputs for the silicon delay line.

If an application requires a single delayed output that can be adjustable, a multiplexing logic circuit is connected to each of the outputs of the delay line. The select input of the multiplexing logic circuits will determine the input of the delay line and the output of the multiplexing logic circuit.

An application of delay lines composed of chains of inverters is the synchronizing of clocks internal to an integrated circuit with external system clocks. Two techniques for synchronizing internal clocks to external clocks are the latched type clock synchronized delay circuit (CSD) and the synchronous mirror delay circuit (SMD). The latched type clock synchronized delay circuit as described in "A1 ps Jitter 2 Clock Cycle Lock Time CMOS Digital Clock Generator Based On An Interleaved Synchronous Mirror Delay Scheme" T. Saeki, H. Nakamura, and J. Shimizu, Digest of Technical Papers—Symposium on VLSI Circuit, IEEE, 1997, is shown in FIG. 1. The input buffer 10 receives the external system clock 5. The input buffer 10 will have a delay factor designated $d_1$. The output 15 of the input buffer 10 will be a first timing clock $X_0$ that is the input to a fixed delay line 20. The fixed delay line 20 will have a delay that is a second delay factor (d1+d2). The delay of the fixed delay line will be determined generally by the delay of a plurality of serially cascaded inverters. The delay of each inverter will generally be on the order of 10–20 ps.

The output 25 of the fixed delay line 20 will be a second timing clock $X_1$ and is the input of the measurement delay line 30. The measurement delay line 30 will be comprised of a plurality of delay elements 30a, 30b, . . . , 30x, . . . , 30n typically are individual stages of a shift register with a control gate. Each delay element 30a, 30b, . . . , 30x, . . . , 30n has an output 35 that is connected to the latch array 40. The latch array 40 has a plurality of parallel latches 40a, 40b, . . . , 40x, . . . , 40n. When the delayed signal from the measurement delay line 30 has aligned with a second pulse of the first timing clock 15, the latch 40x will be triggered.

Each output 45 of the plurality of latches 40a, 40b, . . . , 40x, . . . , 40n will be connected to the variable delay line 50. The variable delay line 50 will have a plurality of serially cascaded delay elements 50a, 50b, . . . , 50x, . . . , 50n. The first timing signal 15 will transferred through each of the serially cascaded delay elements 50a, 50b, . . . , 50x, . . . , 50n until it reaches the selected delay element 50x that is gated by the latch 40x. The output 55 of the variable delay line 50 is the third timing signal $X_3$ and will be the input to the internal buffer 60. The internal buffer 60 will amplify and buffer the third timing signal 55 for transmission to the internal circuitry of the integrated circuit.

The delay of the internal buffer 60 is designated $d_2$, thus the delay of the fixed delay line 20 will be the sum of the delay of the input buffer 10 and the delay of the internal buffer 60. The measured delay time $\tau_m$ from the measurement delay line 30 will be the difference of the clock period $\tau_{ck}$ of the external system clock 5 and the second delay factor (d1+d2) of the fixed delay line 20. That is:

$$\tau_m = \tau_{ck} - (d1+d2).$$

The time to determine the measured period $\tau_m$ will be in the first cycle of the external system clock 5. The synchronization will occur in the second cycle. The variable delay line 50 will delay the first timing signal 15 by the measured period of time $\tau_m$. This will make the internal clock 65 synchronized with the external system clock 5 after two cycles from activation.

The synchronous mirror delay circuit, as described in T. Saeki, H. Nakamura, and J. Shimizu and "A 2.5 ns clock access 250 Mhz 256 Mb SDRAM with a synchronous mirror delay", T. Saeki et al., IEEE International Solid State Circuits Conference, Paper # SP23.4, p. 374–375, 1996 is shown in FIG. 2. The external system clock 105 is the input of the input buffer 110. The delay time of the input buffer 110 will designated the first delay factor d1.

The output 115 of the input buffer 110 will be the first timing signal $X_0$ and is connected to the fixed delay line 120. The output 125 of the fixed delay line 120 will be a second timing signal $X_1$ and will be delayed from the first timing signal 115 by a second delay factor d1+d2.

The second timing signal 125 will be the input to the measurement delay line 130. The measurement delay line 130 is composed of a plurality of serially cascaded delay elements 130a, 130b, . . . , 130x, . . . , 130n. As with the latched-type clock synchronized delay circuit, each delay element is a stage of a shift register with control gates. Each delay element 130a, 130b, . . . , 130x, . . . , 130n has an output 135 that is connected to the transfer gate array 140.

The transfer gate array 140 is composed of a plurality of transfer gates 140a, 140b, . . . , 140x, . . . , 140n. The first timing signal 115 is connected to each of the transfer gates. When the delayed second timing signal 135 has been delayed by an amount that will align the first cycle of the delayed second timing signal 135 with a second cycle of the first timing signal 115, one of the transfer gates 140x will be activated. The delayed second timing signal 135 will be transferred through the selected transfer gate 140x to the variable delay line 150. The measured delay time $\tau_m$ from the measurement delay line 130 is the difference of the clock period $\tau_{ck}$ of the external system clock $X_0$ 105 and the delay factor $(d_1+d_2)$ of the fixed delay line 120. That is:

$$\tau_m = \tau_{ck} - (d_1+d_2)$$

The variable delay line 150 has a plurality of serially connected delay elements 150a, 150b, . . . , 150x, . . . , 150n.

Each delay element 150a, 150b, ..., 150x, ..., 150n has an input that is connected to the output 145 of the transfer gate array 140. The one transfer gate 140x that is activated when the first pulse of the delayed second timing signal 135 is aligned with the first timing signal 115, is connected to the delay element 150x. The transferred delayed second timing signal 145 will be transferred and delayed through the variable delay line to form the third timing signal $X_3$ 155. The delay time through the variable delay line 150 is the same as the measured delay time $\tau_m$. That is:

$$\tau_m = \tau_{ck} - (d_1 + d_2)$$

The third timing signal 155 is the input to the internal buffer 160. The internal buffer 160 will amplify, buffer, and delay the third timing signal 155 to form the internal clock 165. The delay of the internal buffer will be a third delay factor d2 and will align the internal clock 155 with the external system clock 105 after two cycles from activation.

U.S. Pat. No. 5,378,946 (Reime) discloses an edge detection circuit that will detect the transmission of a signal edge between a first state and a second state on a transmission line. The edge detection circuit will create a switching signal that outputs a detection time of the detected signal edge. The time of the detected signal edge is largely independent of the shape of the signal edge that has been transmitted.

U.S. Pat. No. 5,243,227 (Gutierrez, Jr. et al.) describes a delay line for providing fine timing adjustment on subsequent edges of an input signal. The delay line comprises a plurality of delay elements for fine tuning the position in time of the timing edges of the input signal. Each delay element has a data input and data output where the data output is connected to the subsequent delay element's data input, thereby forming a delay line with delay elements connected in series. This implementation facilitates the addition of fine increments of delay to be added to the input signal and thereby enable fine tuning of timing edges. Also, included is a wired-OR multiplexor having data inputs connected to the data outputs of the plurality of the delay elements and a control input to select a particular data output to thereby provide an output signal having delayed timing edges.

U.S. Pat. No. 4,675,546 (Shaw) discloses an edge programmable timing signal generator for generating timing signals having complete edge programmability for accommodating incrementally adjustable variable pulse widths. The timing circuit is particularly useful in memory testing devices, where generation of a multiplicity of clock phases is required. A delay register delays an input timing signal generated by a coarse timing circuit by a predetermined amount of time, and a pair of rising and falling edge delay lines receive and delay the input and delayed timing signals by further predetermined amounts of time. The signals output from the rising and falling edge delay lines are applied to an OR gate, the output of which is applied to an EXCLUSIVE OR gate for selectively inverting the signal output from the OR gate.

SUMMARY OF THE INVENTION

An object of this invention is to provide an edge triggered adjustable delay line circuit to determine the difference in time between a transition of a first signal and a transition of the second signal.

Another object of this invention is to provide a variably additive delay line circuit that will delay an input signal by a delay factor that is the sum of a multiplicity of variable delay factors.

Further another object of this invention is to provide a timing synchronization circuit to synchronize an internal timing signal with an external timing signal within one timing cycle.

To accomplish these and other objects this invention provides an edge activated delay line circuit, a variably additive delay line circuit, and a timing signal synchronization circuit.

An edge activated delay line circuit has a transition input circuit to detect the first signal transition having a first input connected to the first signal and a second input connected to the second signal. The transition input circuit has an output that is connected to the input of a plurality of cascaded delay elements. Each delay element delays the first signal transition by a unit delay time. The edge activated delay line circuit has a transition trigger circuit with an input connected to the second signal to create a transition trigger signal. The transition trigger signal indicates the arrival of the second signal transition. The edge activated delay line circuit further has a plurality of alignment detectors. Each alignment detector has a first input connected to the transition circuit, a second input connected to an input on each delay element, and a third input connected to an output of each delay element. The output of the alignment detector will be activated when the first signal transition has been sufficiently delayed within the plurality of cascaded delay elements to align with the second signal transition.

A variably additive delay line circuit has a plurality of adjustable delay lines. Each adjustable delay line has a plurality of serially connected delay elements. Each delay element will delay the input signal by a unit delay time. The variably additive delay line circuit also has a delay selector circuit to select one of the outputs of the serially connected delay elements for transfer to subsequent adjustable delay lines or external circuitry.

A timing signal synchronization has an input buffer subcircuit to receive, buffer, and amplify the external timing signal. The input buffer subcircuit has a first delay factor that is a delay time of a received external signal from the external timing signal. The input buffer is connected to a fixed delay line circuit to delay the received external timing signal by a second delay factor to create a first timing signal.

A first transition measurement delay line is connected to the fixed delay line to receive the received external timing signal and the first timing signal, to measure a first time difference from a transition of the first timing signal from a first logic level to a second logic level and a transition of the received external timing signal from the second logic level and the first logic level and to retain the measurement of the time difference. The first transition measurement circuit is an edge activated delay line circuit of this invention.

A second transition measurement delay line is connected to the fixed delay line to receive the received external timing signal and the first timing signal, to measure a second time difference from a transition of the first timing signal from the second logic level to the first logic level and a transition of the received external timing signal from the first logic level and the second logic level and to retain the measurement of the time difference. The second transition measurement circuit is an edge activated delay line circuit of this invention.

A first latch array is connected to the first transition measurement delay line to receive the first time difference and to create a first latch signal. A second latch array is connected to the second transition measurement delay line to receive the second time difference and to create a second latch signal.

A variable delay line is connected to the first and second latch array to receive the first and second latch signal to adjust a delay time of the variable delay line to values of the first and second time difference measurements. The first timing signal is delayed by the delay time of the variable delay line to create a second timing signal. The output of the variable delay line is connected to an internal buffer subcircuit to receive, buffer, amplify, and delay by a third delay factor the second timing signal to create the internal timing signal that is synchronized with the external timing signal to circuitry within the integrated circuit.

BRIEF DESCRIPTION OF THE DRAWINGS

FIG. 1 is a block diagram of a latched clock synchronized delay circuit utilizing a delay line of the prior art.

FIG. 2 is a block diagram of a synchronous mirror delay circuit utilizing a delay line of the prior art.

FIG. 3b is a timing diagram of a positive edge triggered delay line of FIG. 3a.

FIG. 4b is a timing diagram of a negative edge triggered delay line of FIG. 4a.

DETAILED DESCRIPTION OF THE INVENTION

Figure 3A:
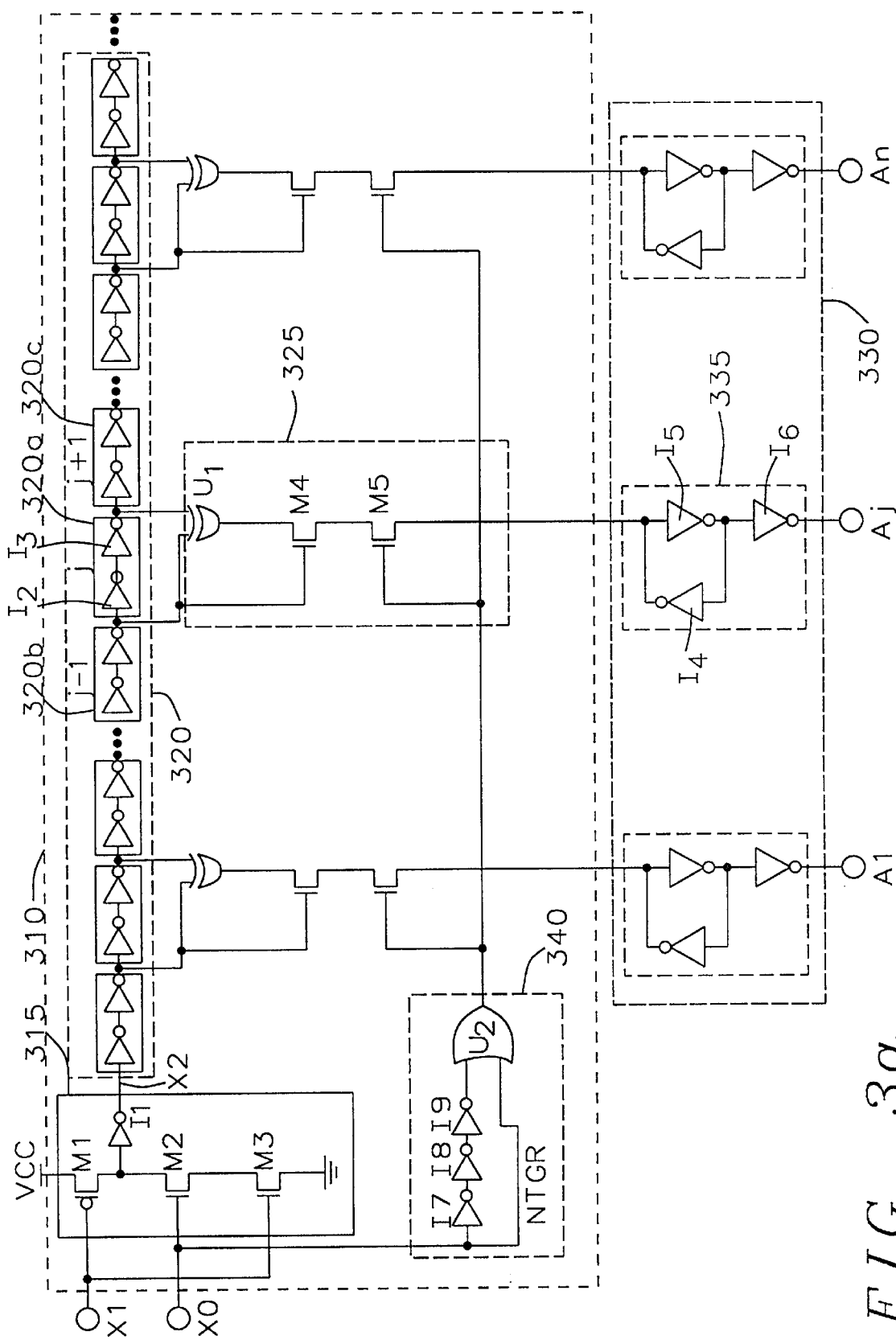
FIG. 3a is a schematic diagram of a positive edge triggered delay line of this invention.
Figure 4A:
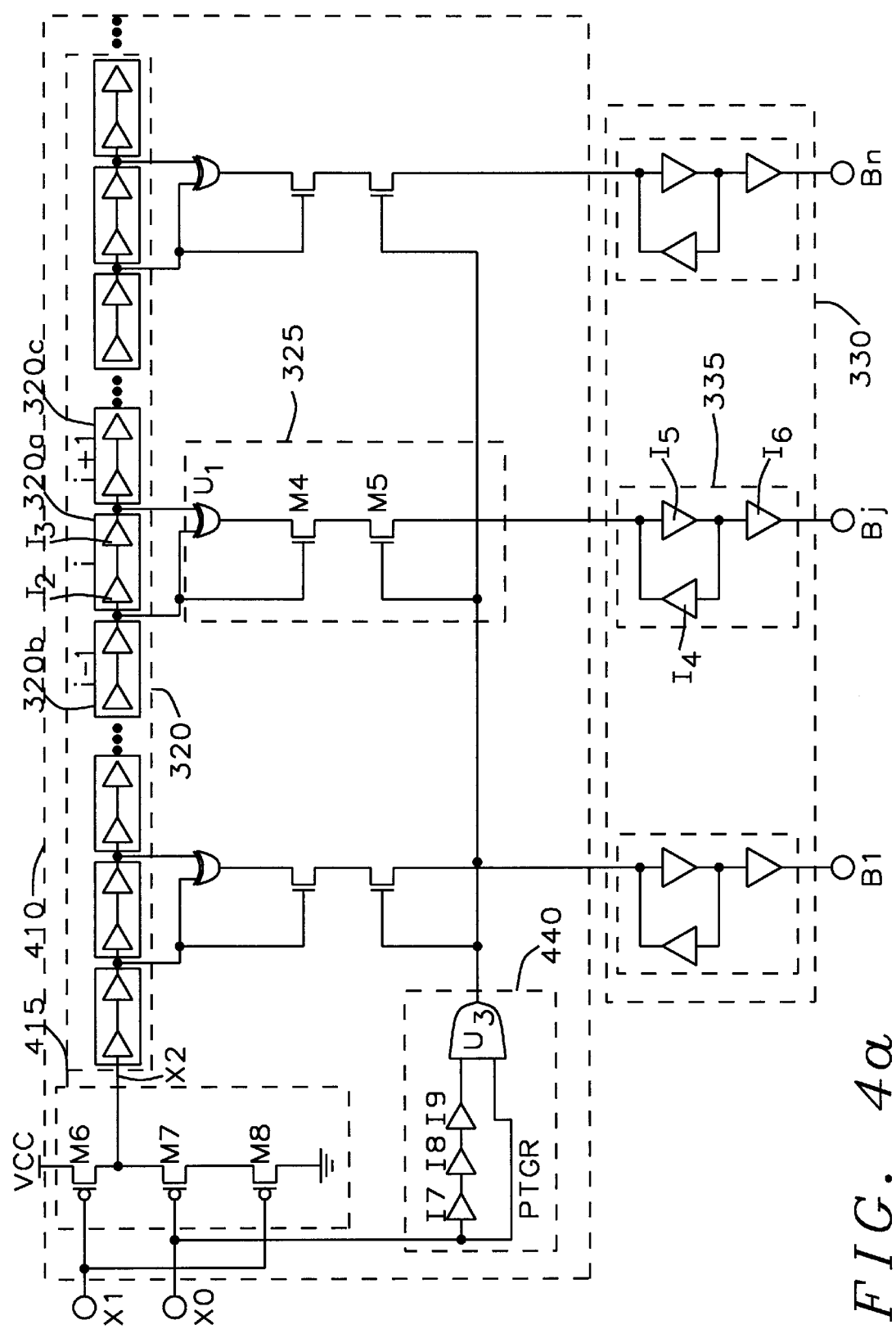
FIG. 4a is a schematic diagram of a negative edge triggered delay line of this invention.

To be able to improve the time to gain first synchronization of the internal clock with the external clock of an integrated circuit such as an SDRAM, the time necessary to determine the skew between the internal clock and the external clock has to be as fast as possible, ideally, one cycle of the clock. To establish the skew on a subcycle basis will require the triggering of a delay line on a transition from a first logic level (0) to a second logic level (1) or from the second logic level (1) to the first logic level (0). FIGS. 3a and 4a show a positive and negative edge triggered delay line. In FIG. 3a the timing signals $X_0$ and $X_1$ are the input signals to the positive trigger delay line 310.

Figure 3B:
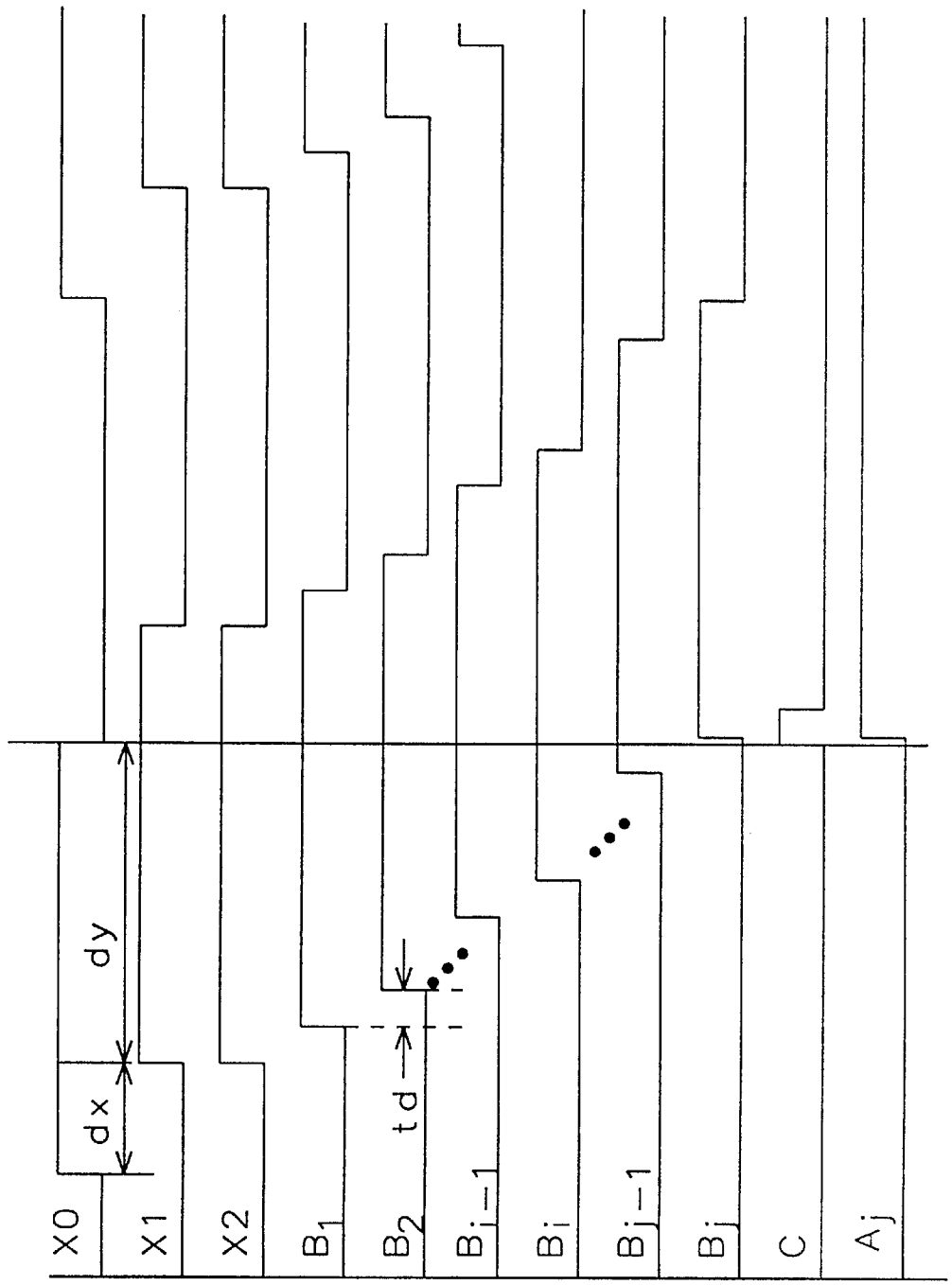

As shown in FIG. 3b, the timing signal $X_1$ will be a digital signal that is identical to the timing signal $X_0$, but delayed by a delay time dx. The positive triggered delay line 310 will determine the time dy of the positive edge or transition from the first logic level (0) to the second logic level (1) of the timing signal $X_1$ to the negative edge or transition from the second logic level (1) to the first logic level (0) of the timing signal $X_0$.

The positive trigger delay line 310 has a delay line input circuit 315. The delay line input circuit 315 has two N-type Metal Oxide Semiconductor (MOS) transistors $M_2$ and $M_3$ and a P-type MOS transistor $M_1$ connected serially together between the power supply voltage source $V_{cc}$ and the ground reference point GND. The delay line input circuit 315 also has an inverter $I_1$. The first timing signal $X_0$ is connected to the gate of the N-type MOS transistor $M_2$ and the second timing signal $X_1$ is connected to the gates of the N-type MOS transistor $M_3$ and the P-type MOS transistor $M_1$. The source of the N-type MOS transistor $M_2$ is connected to the drain of the N-type MOS transistor $M_3$. The drains of the P-type MOS transistor $M_1$ and the N-type MOS transistor $M_2$ are also connected together and to the input of the inverter $I_1$. The output of the inverter $I_1$ is the timing signal $X_2$ that is the input of the delay chain 320.

The delay chain 320 is formed of a plurality of serially connected delay elements such as delay elements 320a, 320b, and 320c. The following discussion will be of the j−1 320b, $j^{th}$ 320a, j+1 320c delay elements of the delay chain 320. Each delay element, such as shown of the $j^{th}$ delay element 320a, is composed of multiple cascaded inverters. In the illustration, the number of inverters is two, $I_2$ and $I_3$. The number of inverters will generally be an even number and will, with the gate delay of each inverter, determine the unit delay $t_d$ of each delay element.

FIG. 3b shows the timing of a series of delay elements $B_1$, $B_2$, ..., $B_{i-1}$, $B_i$, ..., $B_{j-1}$, $B_j$ in the delay chain 320. As can be seen, the delay for each output will be the sum of the incremental delays $t_d$ of all previous delay elements in the delay chain.

The output $B_{j-1}$ of the delay element 320b is connected to the input of the $j^{th}$ delay element 320a and the output $B_j$ of the $j^{th}$ delay element 320a is connected to the input of the j+1 delay element 320c. Additionally, the output $B_{j-1}$ of the j−1 delay element 320b is the first input to the alignment detector $AD_j$ 325 and the output $B_j$ of the $j^{th}$ delay element 320a is the second input to the alignment detector $AD_j$ 325.

The alignment detector $AD_j$ 325 has a difference logic circuit $U_1$ to detect the presence of an edge or transition within the delay element 320a. The difference logic circuit $U_1$ will generally be implemented as an exclusive OR (XOR). The output of the difference logic circuit $U_1$ is connected to the drain of the N-type MOS transistor $M_4$. The gate will turn the N-type MOS transistor $M_4$ on when the output $B_{j-1}$ of the delay element 320b is at the second logic level When the positive edge of the clock or transition from the first logic level (0) to the second logic level (1) is detected by the difference logic circuit $U_1$ and the N-type MOS transistor $M_4$ is turned on, the source of the N-type MOS transistor $M_4$ is activated.

The timing signal $X_0$ is the input to the negative trigger circuit NTGR 340. The negative trigger circuit NTGR 340 consists of the inverters $I_7$, $I_8$, and $I_9$ and NOR circuit $U_2$. The negative trigger circuit NTGR 340 is configured to provide a small positive pulse (C of FIG. 3b) when a negative edge or transition from the second logic level (1) to the first logic level (0) occurs. The duration of the small pulse (c of FIG. 3b) is the total delay of the inverters $I_7$, $I_8$, and $I_9$. The output of the negative trigger circuit NTGR 340 is connected to the gate of the N-type MOS transistor $M_5$. The source of the N-type MOS transistor $M_4$ is connected to the drain of the N-type MOS transistor $M_5$ and the source of the N-type MOS transistors $M_5$ is one of the outputs of the positive edge triggered delay Line 310.

When the negative trigger circuit NTGR 340 detects the negative edge or transition from the second logic level (1) to the first logic level (0) of the timing signal $X_0$ and the positive edge or transition of from the first logic level (0) to the second logic level (1) of the timing signal $X_1$ is present in the $j^{th}$ delay element 320a, the output of the positive triggered delay line will be activated (that is transition from the first logic level (0) to the second logic level (1)).

The total number of delay elements 320a, 320b, and 320c is such that the total delay is slightly shorter than one external clock period $X_0$, but longer than one half of the external clock period $X_0$. In this way, there is only one output of the positive triggered delay line 315 will be activated.

Each of the outputs (the source of the N-type MOS transistor $M_5$) of the positive trigger delay line 310 is connected to the input of the latch array 330. The latch array 330 is composed of a plurality of latches 335. One of the latches will set to capture and retain the activated output of the positive triggered delay line 310. Only one output $A_1, \ldots, A_i, \ldots, A_n$ of the latch array 330 will have the captured output available for subsequent circuitry.

The latches as described for the latch $L_j$ 335 consist of inverters $I_4$, $I_5$, and $I_6$. The output of invert $I_4$ is connected to the input of the inverter $I_5$ and the output of the inverter $I_5$ is connected to the input of the inverter $I_4$, to form a latching circuit. The output of the inverter $I_5$ is also connected to the input of the inverter $I_6$. The inverter $I_6$ will buffer the signal to create the output $A_j$. The signal $A_j$ is shown in FIG. 3b as being set when the negative edge or transition of from the second logic level (1) to the first logic level (0) of the timing signal $X_0$ is aligned with the positive edge or transition from the first logic level (0) to the second logic level (1) of the delayed positive timing signal $X_1$.

The negative edge triggered delay line is shown in FIG. 4a. The negative edge triggered delay line 410 is identical to the structure and operation of the positive edge triggered delay line 310 of FIG. 3a, except for the following described modifications to the delay line input circuit 415 and the negative trigger circuit which is now a positive trigger circuit 440.

The delay line input circuit 415 consists of two P-type MOS transistors $M_6$ and $M_7$ and an N-type MOS transistor $M_8$ connected serially between the power supply voltage source $V_{cc}$ and the ground reference point Gnd. The gate of the P-type MOS transistor $M_7$ is connected to the timing signal $X_0$. The gates of the P-type MOS transistor $M_6$ and the N-type MOS transistor $M_8$ are connected to the timing signal $X_1$. The drains of the P-type MOS transistor $M_7$ and the N-type MOS transistor $M_8$ are connected together. The drain of the P-type MOS transistor $M_6$ and the source of the P-type MOS transistor $M_7$ are connected together and to the input of the chain of delay elements 320.

Figure 4B:
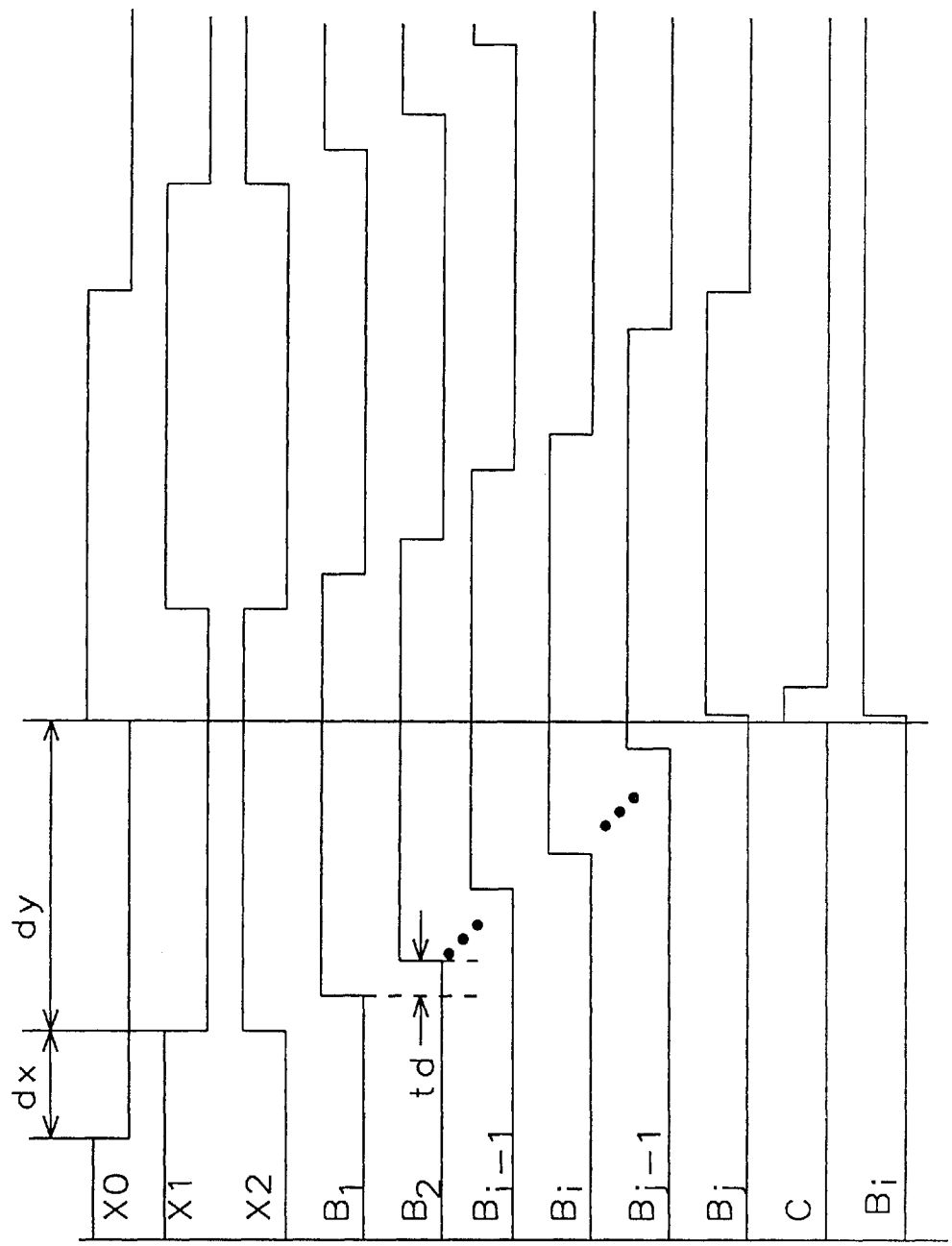

FIG. 4b shows the signals of the circuits of FIG. 4a. The timing signal $X_1$ is identical to the timing signal $X_0$, but delayed by the delay factor dx. The output $X_2$ of the delay line input circuit 415 is shown as an inverted form of the timing signal $X_1$.

The positive trigger circuit 440 will detect the positive edge or transition from the first logic level (0) to the second logic level (1) of the timing signal $X_0$. The inverters $I_7$, $I_8$, and $I_9$ and the AND circuit $U_3$ make up the positive trigger circuit 440. The positive trigger circuit 440 will create a small pulse (C of FIG. 4b) at the arrival of the positive edge or transition from the first logic level (0) to the second logic level (1) of the timing signal $X_0$. The duration of the small pulse c of FIG. 4b is simply the total delay time of the inverters $I_7$, $I_8$, and $I_9$.

These above described modifications will allow for the determination of the delay time dy of FIG. 4b between the negative edge or transition from the second logic level (1) to the first logic level (0) of the timing signal $X_1$ and the positive edge or transition from the first logic level (0) to the second logic level (1) of the timing signal $X_0$. In this case the timing signal $X_2$ will be delay incrementally through each delay element. The positive trigger circuit 440 will generate the small pulse C of FIG. 4b will activate the N-type MOS transistor $M_5$. The latch will set and retain the alignment of the negative edge or transition from the second logic level (1) to the first logic level (0) of the timing signal $X_1$ and the positive edge or transition from the first logic level (0) to the second logic level (1) of the timing signal $X_0$. The output $B_i$ of the latch array 330 will activate to transfer the signal to subsequent circuitry.

Figure 5:
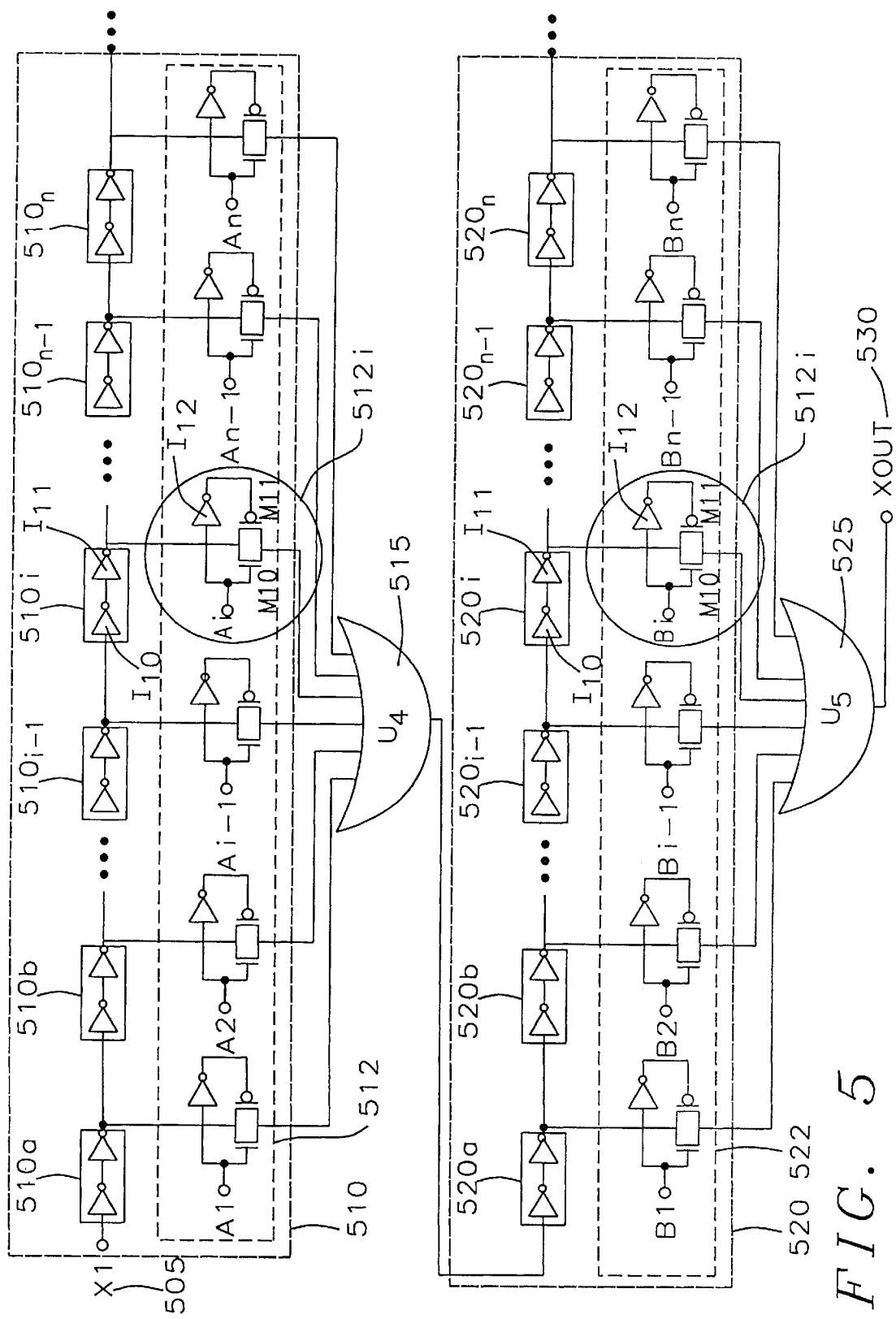
FIG. 5 is schematic diagram of a variably additive delay line circuit of this invention.

Refer now to FIG. 5 for a description of a variably additive delay line of this invention. A timing signal $X_1$ is the input to a selectively adjustable delay line 510. The selectively adjustable delay line 510 is composed of a plurality of cascaded delay elements $510_a$, $510_b$, ..., $510_{i-1}$, $510_i$, ..., $510_{n-1}$, and $510n$. Each delay element such as $510_i$ is composed of multiple inverters $I_{10}$ and $I_{11}$. The delay element $510_i$ will generally have an even number of inverters. The element delay $t_d$ will be determined by the number of inverters within the delay element as well as the individual delays of the inverters. The outputs of the delay elements $510_{i-1}$ are connected to the input of the following delay element $510_i$.

Connected to the output of each delay element $510_i$ is a pass gate 512. The pass gate 512 is composed of N-channel MOS transistor $M_{10}$, and the P-channel MOS transistor $M_{11}$, and an inverter $I_{12}$. The N-channel MOS transistor $M_{10}$ and the P-channel MOS transistor $M_{11}$, are connected in parallel to form a pass gate. The input of each pass gate is connected to a select signal $A_1, A_2, \ldots, A_{i-1}, A_i, \ldots, A_{n-1}$, and $A_n$. To determine the delay through the selectively adjustable delay 510, only one select signal $A_1, A_2, \ldots, A_{i-1}, A_i, \ldots, A_{n-1}$, and $A_n$ will be activated to turn on the selected pass gate 512. The outputs of all the pass gates will be inputs to the logic summing gate (OR) $U_4$ 515. The output of the one activated pass gate will be available for a subsequent selectively adjustable delay line 520. The selectively adjustable delay line 510 will delay the timing signal $X_1$ by the amount of delay of the sum of the delay elements to the activated pass gate.

The second selectively adjustable delay line 520 is identical to the first selectively adjustable delay line 510. Only one of the select signals $B_1, B_2, \ldots, B_{i-1}, B_i, \ldots, B_{n-1}$, and $B_n$ will activate the correspondingly appropriate pass gate $522_i$. One of the delay elements $520_a$, $520_b$, ..., $520_{i-2}$, $520_i$, ..., $520_{n-2}$, and $520_n$ will transfer the delayed timing signal to the output of the pass gate $522_i$.

As described above the outputs of all the pass gates 522 will be connected to the logic summing circuit (OR) $U_5$ 525 is transfer to subsequent circuitry through the terminal XOUT 530.

Generally the logic summing circuits (OR) $U_4$ 515 and $U_5$ 525 can be implemented as "wired or". The logic summing circuits (OR) $U_4$ 515 and $U_5$ 525 can also be physically implemented as multistage OR circuits, in order to avoid large number of inputs to the logic summing circuits (OR) $U_4$ 515 and $U_5$ 525.

It will be apparent to those skilled in the art that any number of selectively adjustable delay lines can be cascaded to form the variably additive delay line.

Figure 6:
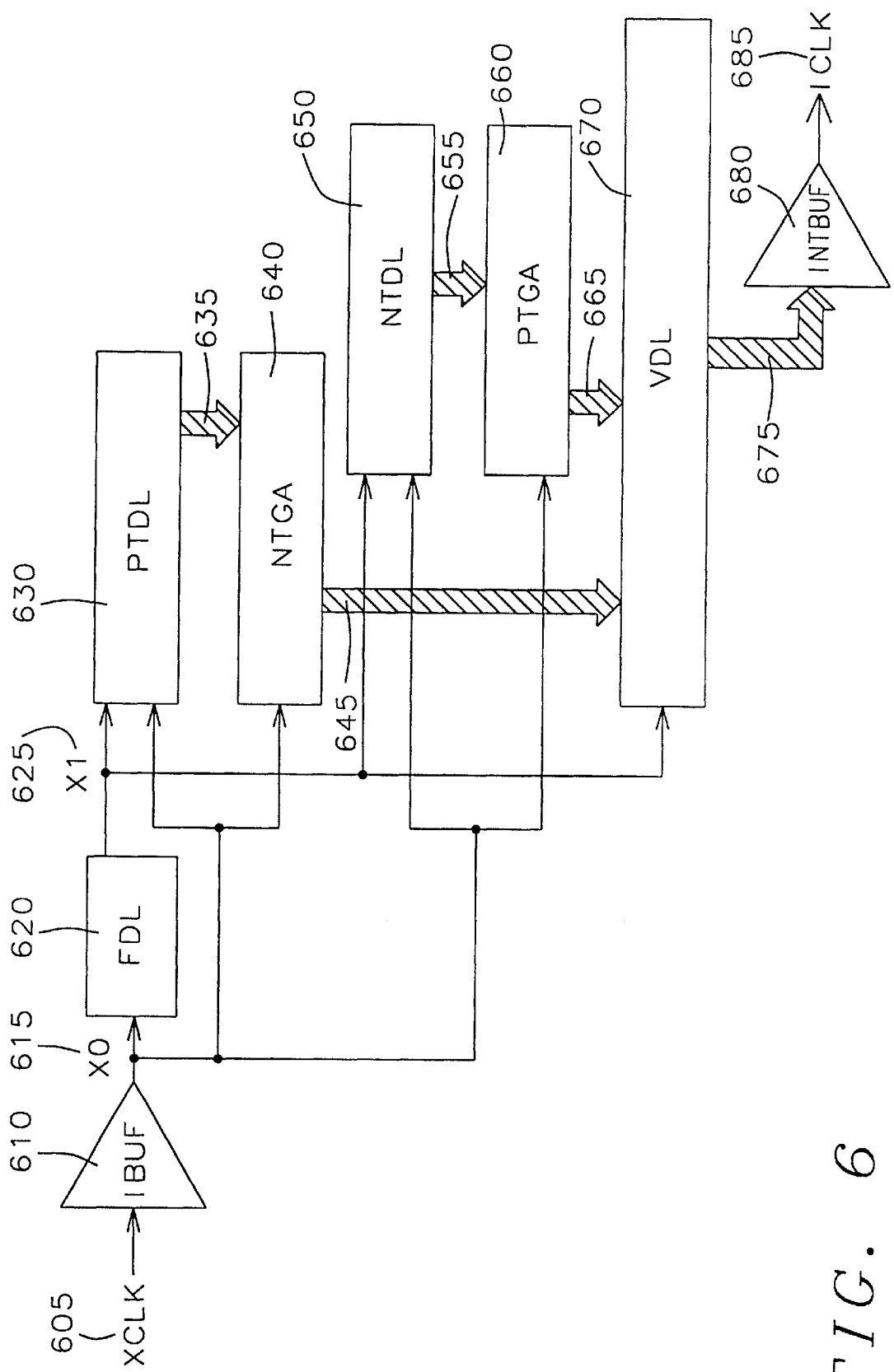
FIG. 6 is a block diagram of a timing synchronization circuit utilizing the positive and negative edge triggered delay line circuits and the variably additive delay line circuits of this invention.

Pending application Ser. No. 09/047,541 assigned to the same assignee as the present invention describes an edge triggered latch type clock synchronized delay circuit. The basic structure of an edge triggered latch type clock synchronized delay circuit utilizing the positive and negative edge triggered delay line circuits and the variably additive delay line circuits of this invention is described in FIG. 6.

An external system clock XCLK 605 is the input to an input buffer 610. The input buffer 610 will be essentially a CMOS inverter and will have a delay that is designated the first delay factor d1. The output of the input buffer 610 is the first timing signal X₀ 615. The first timing signal X₀ 615 is the input to the fixed delay line 620. The first timing signal X₀ 615 is delayed by a second delay factor d1+d2 to form the second timing signal X₁ 625. The second delay factor d1+d2 is the sum of the first delay factor d1 and a third delay factor d2 that is the delay of the internal buffer 680.

The first timing signal $X_0$ 615 and the second timing signal $X_1$ 625 is the input to the first measurement delay line 630. The first measurement delay line 630 is a positive triggered delay line of FIG. 3a.

The positive edge triggered delay line 630 will be activated by the positive edge or transition from the first logic level (0) to the second logic level (1) of the first timing signal $X_0$ 615. The positive edge triggered delay line 630 when activated will determine the delay (dy of FIG. 3b) between the positive edge or transition from the first logic level (0) to the second logic level (1) of the first timing signal $X_0$ 615 and negative edge or transition from the second logic level (1) to the first logic level (0) of the second timing signal $X_1$ 625.

The positive trigger delay line 630 has multiple outputs 635 that are inputs to the negative edge triggered latch array 640. The negative edge triggered latch array 640 will be made up of a plurality of negative edge triggered latches, as shown in FIG. 3a. When the first timing signal $X_0$ 615 and the second timing signal $X_1$ 625 have aligned one of the latches of the negative edge triggered latch array 640 will be set and the output 645 will be activated to transmit the first latch signal to the variable delay line VDL 670.

The first timing signal $X_0$ 615 and the second timing signal $X_1$ 625 are inputs to the negative edge triggered delay line 650. The negative edge triggered delay line 650 is as described in FIG. 4a. The falling edge of the first timing signal $X_0$ 615 will trigger the negative edge measurement delay line 650 to function. The negative edge measurement delay line 650 will transfer the second timing signal $X_1$ 625 through each delay element of the negative edge delay line 650.

When the falling edge of the second timing signal $X_1$ 625 has aligned with the second rising edge of the first timing signal $X_0$ 615, one of the outputs 655 of the negative edge measurement delay line 650 will be valid. At this time, one of the latches of the positive latch array 660 will be triggered by the rising edge of the first timing signal $X_0$ 615. The triggering of the positive edge triggered latch 660 will create a second latch signal 665.

The second timing signal $X_1$ 625 is the delay input to the variable delay line 670. The variable delay line 670 will be as described in FIG. 5. The first latch signal 645 and the second latch signal 665 will select respectively the delay factors of the variable delay line 670. The delay element selected will be situated within the variable delay line 670, such that the second timing signal $X_1$ 625 will be delayed by a fourth delay factor that is the difference dy of FIG. 3b between the positive edge or transition from the first logic level (0) to the second logic level (1) of the second timing signal $X_1$ 625 and negative edge or transition from the second logic level (1) to the first logic level (0) of the first timing signal $X_0$ 615.

The second latch signal 665 will select the delay element of the variable delay line 670 to provide the third timing signal 675. The delay elements between the first selected delay element and the second selected delay will delay the second timing signal $X_1$ 625 by the fifth delay factor. The fifth delay factor will be the difference dy of FIG. 4b between the negative edge or transition from the second logic level (1) to the first logic level (0) of the second timing signal $X_1$ 625 and positive edge or transition from the first logic level (0) to the second logic level (1) of the first timing signal $X_0$ 615.

The output of the variable delay line 670 will be the third timing signal 675. The third timing signal 675 is the input of the internal buffer 680. The output of the internal buffer 680 is the internal clock ICLK 685. The delay of the internal buffer 680 is the third delay factor d2. The total delay $\tau_{dtot}$ from the input of the input buffer 610 to the output of the output buffer 680 will then be:

$$\tau_{dtot}=d1+(d1+d2)+dy1+dy2+d2$$

$$\tau_{dtot}=d1+(d1+d2)+[\tau_a-(d1+d2)]+[\tau_b-(d1+d2)]+d2$$

$$\tau_{dtot}=\tau_a+\tau_b.$$

where:
 $\tau_a$ is the time the external clock XCLK is at the second logic level (1).
 $\tau_b$ is the time the external clock XCLK is at the first logic level (0).
 $\tau_a+\tau_b$ is equal to the external clock XCLK period.
 dy1 is the delay factor dy of FIG. 3b.
 dy2 is the delay factor dy of FIG. 4b.

Thus, the internal clock ICLK 685 will have been synchronized with the external clock XCLK 605 within one cycle of the external clock XCLK 605.

While this invention has been particularly shown and described with reference to the preferred embodiments thereof, it will be understood by those skilled in the art that various changes in form and details may be made without departing from the spirit and scope of the invention.

The invention claimed is:

1. An edge activated delay line circuit to determine a delay factor between a first signal transition between a first logic level and a second logic level and a second signal transition between the second logic level and a first logic level, comprising:
  a) a transition input circuit to detect the first signal transition having a first input connected to the first signal and a second input connected to the second signal, and an output;
  b) a plurality of cascaded delay elements connected to the transition detect circuit, whereby each delay element delays the first signal transition by a unit delay time;
  c) a transition trigger circuit having an input connected to the second signal to create a transition trigger signal to indicate arrival of the second signal transition; and
  d) a plurality of alignment detectors whereby each alignment detector has a first input connected to the transition trigger circuit, a second input connected to an input on one delay element, a third input connected to an output of one delay element, and an output that is activated when the first signal transition has been sufficiently delayed within the plurality of cascaded delay elements to align with the second signal transition.

2. The edge activated delay circuit of claim 1 further comprising a plurality of transition trigger latches whereby each transition trigger latch is connected to the output of one alignment detector to capture and retain the determination of the delay factor.

3. The edge activated delay circuit of claim 1 wherein the transition input circuit comprises:

a) a first MOS transistor of a first conductivity type having a gate connected to the first signal, a source connected to the ground reference point, and a drain;

b) a second MOS transistor of the first conductivity type having a gate connected to the first signal, a source connected to the drain of the first MOS transistor, and a drain;

c) a first MOS transistor of a second conductivity type having a gate connected to the second signal, a source connected to a power supply voltage source, and a drain connected to the drain of the second MOS transistor of the first conductivity type; and d) an inverter having an input terminal connected to the drains of the second MOS transistor of the first conductivity type and the first MOS transistor of a second conductivity type, and an output terminal connected to the output of said transition input circuit.

4. The edge activated delay circuit of claim 1 wherein the transition input circuit comprises:

a) a first MOS transistor of a first conductivity type having a gate connected to the first signal, a source connected to the ground reference point, and a drain;

b) a first MOS transistor of a second conductivity type having a gate connected to the second signal, a drain connected to the drain of the first MOS transistor, and a source; and c) a second MOS transistor of a second conductivity type having the gate connected to the first signal, a source connected to a power supply voltage source, and a drain connected to the source of the first MOS transistor of the second conductivity type and to the output of said transition input circuit.

5. The edge activated delay circuit of claim 1 wherein each delay element comprises an even number of serially connected inverter gates whereby the unit delay time is determined by a quantity of inverter gates and a gate delay of each inverter gate.

6. The edge activated delay circuit of claim 1 wherein the alignment detector comprises:

a) a difference logic circuit having a first logic input connected to the second input, a second logic input connected to the third input, and an output to create a transition signal to indicate the first signal transition is present in one delay element attached to the alignment detector;

b) a fourth MOS transistor of a first conductivity type having a gate connected to the second input, a drain connected to the output of the difference logic circuit, and a source; and c) a fifth MOS transistor of the first conductivity type having a gate connected to the transition trigger circuit to receive the transition trigger signal, a drain connected to the source of the fourth MOS transistor, and a source connected to the output of said alignment detector that will activate when transition signal and the transition trigger signal are simultaneously activated.

7. The edge activated delay circuit of claim 1 wherein the transition trigger circuit will detect a transition from the first logic level to the second logic level.

8. The edge activated delay circuit of claim 1 wherein the transition trigger circuit will detect a transition from the second logic level to the first logic level.

9. A variably additive delay line circuit to delay an input signal by a delay factor that is the sum of a multiplicity of variable delay factors, comprising a plurality of cascaded adjustable delay lines, whereby each of the cascaded adjustable delay lines comprises:

a) a plurality of serially connected delay elements, whereby each delay element will delay the input signal by a unit delay time; and b) a delay selector circuit having a plurality of inputs, each input connected to one output of the serially connected delay elements to select one of the outputs of the serially connected delay elements for transfer to subsequent adjustable delay lines and external circuitry, wherein the delay selector circuit comprises:

a plurality of pass gates whereby each pass gate has a gating input connected to a selection input which when activated will select one output of the serially connected delay elements, a drain input connected to the selected output of the serially connected delay elements, and a source output; and a logic OR gate having a plurality of inputs whereby each input is connected to the source output of the plurality of pass gates, and an output containing the input signal that has been delayed by one of the variable delay factors.

10. The variably additive delay line circuit of claim 9 wherein each delay element is an even number of inverter gates whereby the unit delay time is determined by the gate delay time of each inverter gate and the number of inverter gates.

11. The variably additive delay line circuit of claim 9 wherein the logic OR is a wired OR connection.

12. A timing signal synchronization circuit to synchronize an internal timing signal of an integrated circuit with an external timing signal within one cycle of said external timing signal, comprising:

a) an input buffer subcircuit to receive, buffer, and amplify said external timing signal, whereby said input buffer subcircuit has a first delay factor that is a delay time of a received external timing signal from said external timing signal;

b) a fixed delay line circuit connected to the input buffer subcircuit to delay the received external timing signal by a second delay factor to create a first timing signal;

c) a first transition measurement delay line connected to the input buffer subcircuit and the fixed delay line to receive the received external timing signal and the first timing signal, to measure a first time difference from a transition of the first timing signal from a first logic level to a second logic level and a transition of the received external timing signal from the second logic level and the first logic level and to retain said measurement of said time difference, comprising:

a first transition input circuit to detect the first timing signal transition from the first logic level to the second logic level, having a first input connected to the received external timing signal and a second input connected to the first timing signal signal, and an output;

a first plurality of cascaded delay elements connected to the first transition input circuit, whereby each delay element delays the first timing signal transition from the first logic level to the second logic level by a first unit delay time;

a first transition trigger circuit having an input connected to the received external timing signal to create a first transition trigger signal to indicate arrival of the received external timing signal transition from the second logic level to the first logic level; and a first plurality of alignment detectors whereby each alignment detector has a first input connected to the first transition trigger circuit, a second input connected to an input on one delay element, a third input connected to an output of one delay element, and an output that is activated when the first timing signal transition from the first logic level to the second logic level has been sufficiently delayed within the plurality of cascaded delay elements to align with the received external timing signal transition from the second logic level to the first logic level;

d) a second transition measurement delay line connected to the input buffer subcircuit and the fixed delay line to receive the received external timing signal and the first timing signal, to measure a second time difference from a transition of the first timing signal from the second logic level to the first logic level and a transition of the received external timing signal from the first logic level and the second logic level and to retain said measurement of said time difference, comprising:

a second transition input circuit to detect the first timing signal transition from the second logic level to the first logic level, having a first input connected to the received external timing signal and a second input connected to the first timing signal, and an output;

a second plurality of cascaded delay elements connected to the transition detect circuit, whereby each delay element delays the first timing signal transition from the second logic level to the first logic level by a second unit delay time;

a second transition trigger circuit having an input connected to the received external timing signal to create a second transition trigger signal to indicate arrival of the received external timing signal transition from the first logic level to the second logic level; and a second plurality of alignment detectors whereby each alignment detector has a first input connected to the second transition trigger circuit, a second input connected to an input on one delay element, a third input connected to an output of one delay element, and an output that is activated when the first timing signal transition from the second logic level to the first logic level has been sufficiently delayed within the plurality of cascaded delay elements to align with the received external timing signal transition from the first logic level to the second logic level;

e) a first latch array connected to the first transition measurement delay line to receive said first time difference and to create a first latch signal;

f) a second latch array connected to the second transition measurement delay line to receive said second time difference and to create a second latch signal;

g) a variable delay line connected to the first and second latch array to receive the first and second latch signal to adjust a delay time of said variable delay line to values of measurements of a first part and a second part of a period of the first timing signal less the second delay factor, and connected to the fixed delay line to receive the first timing signal and to delay said first timing signal by the delay time said variable delay line to create a second timing signal; and h) an internal buffer subcircuit to receive, buffer, amplify, and delay by a third delay factor the second timing signal to create the internal timing signal that is synchronized with said external timing signal to circuitry within said integrated circuit.

13. The timing signal synchronization circuit of claim 12 whereby the input buffer subcircuit is a CMOS inverter.

14. The timing signal synchronization circuit of claim 12 wherein the fixed delay line is a plurality of serially cascaded CMOS inverters designed to have a cumulative delay time of the second delay factor.

15. The timing signal synchronization circuit of claim 12 whereby the second delay factor is the sum of the first and third delay factors.

16. The timing signal synchronization circuit of claim 12 wherein the first latch array and the second latch array each comprise a plurality of transition trigger latches whereby each transition trigger latch is connected to the output of one alignment detector to capture and retain the determination of the delay factor.

17. The timing signal synchronization circuit of claim 12 wherein the first transition input circuit comprises:

a) a first MOS transistor of a first conductivity type having a gate connected to the first timing signal, a source connected to the ground reference point, and a drain;

b) a second MOS transistor of the first conductivity type having a gate connected to the second timing signal, a source connected to the drain of the first MOS transistor, and a drain, c) a first MOS transistor of a second conductivity type having a gate connected to the second timing signal, a source connected to a power supply voltage source, and a drain connected to the drain of the second MOS transistor of the first conductivity type; and d) an inverter having an input terminal connected to the drains of the second MOS transistor of the first conductivity type and the first MOS transistor of a second conductivity type, and an output terminal connected to the output of said transition input circuit.

18. The timing signal synchronization circuit of claim 12 wherein the second transition input circuit comprises:

a) a first MOS transistor of a first conductivity type having a gate connected to the first timing signal, a source connected to the ground reference point, and a drain;

b) a first MOS transistor of a second conductivity type having a gate connected to the second timing signal, a drain connected to the drain of the first MOS transistor, and a source; and c) a second MOS transistor of the second conductivity type having a gate connected to the first timing signal, a source connected to a power supply voltage source, and a drain connected to the source of the first MOS transistor of the second conductivity type and to the output of said transition input circuit.

19. The timing signal synchronization circuit of claim 12 wherein each delay element comprises an even number of serially connected inverter gates whereby the unit delay time is determined by a quantity of inverter gates and a gate delay of each inverter gate.

20. The timing signal synchronization circuit of claim 12 wherein each alignment detector comprises:

a) a difference logic circuit having a first logic input connected to the second input, a second logic input connected to the third input, and an output to create a transition signal to indicate the first signal transition is present in one delay element attached to the alignment detector;

b) a fourth MOS transistor of a first conductivity type having a gate connected to the second input, a drain connected to the output of the difference logic circuit, and a source; and c) a fifth MOS transistor of the first conductivity type having a gate connected to the transition trigger circuit to receive the transition trigger signal, a drain connected to the source of the fourth MOS transistor, and a source connected to the output of said alignment detector that will activate when the transistor signal and the transition trigger signal are simultaneously activated.

21. The timing signal synchronization circuit of claim 12 wherein the variably delay line circuit comprises:
   a) a plurality of serially connected delay elements, whereby each delay element will delay the input signal by a unit delay time; and
   b) a delay selector circuit having a plurality of inputs, each input connected to one output of the serially connected delay elements to select one of the outputs of the serially connected delay elements for transfer to subsequent adjustable delay lines and external circuitry.

22. The timing signal synchronization circuit of claim 21 wherein each delay element is an even number of inverter gates whereby the unit delay time is determined by the gate delay time of each inverter gate and the number of inverter gates.

23. The timing signal synchronization circuit of claim 21 wherein the delay selector circuit comprises:
   a) a plurality of pass gates whereby each pass gate has a gating input connected to a selection input which when activated will select one output of the serially connected delay elements, a drain input connected to the selected output of the serially connected delay elements, and a source output; and
   b) a logic OR gate having a plurality of inputs whereby each input is connected to the source output of the plurality of pass gates, and an output containing the input signal that has been delayed by one of the variable delay factors.

24. The timing signal synchronization circuit of claim 23 wherein the logic OR is a wired OR connection.

* * * * *